United States Patent
Fish et al.

(10) Patent No.: US 9,762,016 B2
(45) Date of Patent: Sep. 12, 2017

(54) APPARATUS, BRUSH HOLDER AND SYSTEM FOR MONITORING BRUSH WEAR

(71) Applicant: General Electric Company, Schenectady, NY (US)

(72) Inventors: William Earl Fish, Amsterdam, NY (US); Albert Eugene Steinbach, Rotterdam, NY (US); James Warren Pemrick, Troy, NY (US)

(73) Assignee: General Electric Company, Schenectady, NY (US)

( * ) Notice: Subject to any disclaimer, the term of this patent is extended or adjusted under 35 U.S.C. 154(b) by 31 days.

(21) Appl. No.: 15/084,710

(22) Filed: Mar. 30, 2016

(65) Prior Publication Data

US 2016/0211634 A1    Jul. 21, 2016

Related U.S. Application Data

(63) Continuation-in-part of application No. 13/668,353, filed on Nov. 5, 2012, now Pat. No. 9,331,555.

(51) Int. Cl.

| | |
|---|---|
| *H01R 39/58* | (2006.01) |
| *H02K 11/25* | (2016.01) |
| *H02K 11/20* | (2016.01) |
| *H01H 1/00* | (2006.01) |
| *G01R 31/34* | (2006.01) |
| *H02K 23/66* | (2006.01) |
| *H02K 13/00* | (2006.01) |

(52) U.S. Cl.
CPC .......... *H01R 39/58* (2013.01); *H01H 1/0015* (2013.01); *H02K 11/20* (2016.01); *H02K 11/25* (2016.01); *G01R 31/343* (2013.01); *H02K 13/00* (2013.01); *H02K 23/66* (2013.01)

(58) Field of Classification Search
CPC ........ H01R 39/58; H02K 11/20; H02K 11/25; H02K 13/00; H02K 23/66; G01R 31/343; H01H 1/0015
USPC ...................................................... 310/68 B
See application file for complete search history.

(56) References Cited

U.S. PATENT DOCUMENTS

| | | | |
|---|---|---|---|
| 4,528,557 A * | 7/1985 | Braun | H01R 39/58 340/648 |
| 7,005,964 B2 * | 2/2006 | Edmonson | G06K 19/0675 310/313 B |
| 7,705,744 B2 | 4/2010 | Cutsforth | |
| 8,054,190 B2 | 11/2011 | Hobelsberger | |
| 8,084,704 B2 | 12/2011 | Mark et al. | |
| 8,120,503 B2 | 2/2012 | Mark et al. | |
| 8,159,396 B2 | 4/2012 | Folden et al. | |

(Continued)

*Primary Examiner* — Alex W Mok
(74) *Attorney, Agent, or Firm* — James W. Pemrick; Ernest G. Cusick; Frank A. Landgraff

(57) ABSTRACT

An apparatus for use with a dynamoelectric machine includes a main body configured for attachment to a brush holder. A proximity sensor is on the main body, and the proximity sensor is configured for detecting the presence of a brush located at least partially inside the brush holder. The apparatus receives power from a battery located inside the apparatus, and transmits a wireless signal. The wireless signal is transformable into an indication of a remaining life of the brush. The apparatus is configured to be fully operational when the dynamoelectric machine is neither energized nor in operation, as the apparatus receives power from the battery.

20 Claims, 6 Drawing Sheets

(56) References Cited

U.S. PATENT DOCUMENTS

| | | | |
|---|---|---|---|
| 8,165,552 B2 * | 4/2012 | Rofougaran | H04B 5/0075 343/728 |
| 2003/0011388 A1 * | 1/2003 | Klaar | H01R 39/58 324/723 |
| 2008/0101895 A1 * | 5/2008 | Holcomb | B25J 15/0226 414/226.02 |
| 2009/0153089 A1 * | 6/2009 | Hobelsberger | H01R 39/58 318/490 |
| 2009/0267782 A1 * | 10/2009 | Mark | G01R 31/343 340/648 |
| 2011/0210837 A1 * | 9/2011 | Jin | F02N 11/10 340/438 |
| 2012/0169176 A1 | 7/2012 | Toledo et al. | |
| 2012/0206010 A1 | 8/2012 | Kuban et al. | |
| 2012/0248929 A1 | 10/2012 | Fish et al. | |
| 2014/0125206 A1 | 5/2014 | Fish et al. | |

\* cited by examiner

000# APPARATUS, BRUSH HOLDER AND SYSTEM FOR MONITORING BRUSH WEAR

CROSS-REFERENCE TO RELATED APPLICATIONS

This application is a continuation-in-part of U.S. application Ser. No. 13/668,353, filed Nov. 5, 2012, currently pending.

FIELD OF THE INVENTION

The subject matter disclosed herein relates to dynamoelectric machines. More particularly, the subject matter disclosed herein relates to an apparatus, brush holder and a system for monitoring brush wear in a dynamoelectric machine.

BACKGROUND OF THE INVENTION

Conventional dynamoelectric machines include a rotor having windings that conduct electrical current during operation of the machine. As the rotor rotates, rotating and stationary elements are used to conduct current to the rotor windings from a source external to the rotor. The rotating elements such as collector rings or commutators make contact with stationary brushes to conduct the current. These brushes are held in contact with the rotating elements by brush holders. The brush and commutator system can be subject to electrical current-related effects (e.g., brush selectivity/unequal current sharing between the parallel electrical paths through multiple brushes, sparking between the brush and collector ring or commutator, arcing between the brush and collector ring or commutator, flashover etc.) which may negatively impact performance of the dynamoelectric machine.

In the past, systems or processes have been provided for monitoring brush wear. One known system includes electrical conductors attached to each brush holder that extend external to the machine. Because of the generally high electrical voltage and the high potential energies which exist in dynamoelectric machines (e.g., a generator), this results in a major potential danger. Measures to cope with this potential change are generally quite complex. One known process is to have a technician physically look at each brush and visually detect if the wear is beyond desired limits. However, it can be difficult to see each brush and if a system (as described above) is implemented, then the maze of electrical conductors attached to each brush holder interferes with visual inspections.

BRIEF DESCRIPTION OF THE INVENTION

A first aspect of the invention provides an apparatus configured for use with a dynamoelectric machine. The apparatus includes a main body configured for attachment to a brush holder. A proximity sensor is on the main body, and the proximity sensor is configured for detecting the presence of a brush located at least partially inside the brush holder. The apparatus receives power from a battery located inside the apparatus, and the apparatus is configured to transmit a wireless signal. The wireless signal is transformable into an indication of a remaining life of the brush. The apparatus is fully operational when the dynamoelectric machine is neither energized nor in operation, as the apparatus receives power from the battery.

Another aspect of the invention provides an apparatus having a brush holder configured for holding a brush. The brush holder is configured for use in a dynamoelectric machine. A brush sensor is attached to the brush holder. The brush sensor includes a proximity sensor configured for detecting the presence of the brush located at least partially inside the brush holder. The brush sensor contains a battery located inside the brush sensor, and the brush sensor is configured to transmit a wireless signal. The wireless signal is transformable into an indication of a remaining life of the brush, and the brush sensor receives its power from the battery.

Yet another aspect of the invention provides a system having a brush holder configured for holding a brush. The brush holder is configured for use in a dynamoelectric machine. A brush sensor is attached to the brush holder. The brush sensor includes a proximity sensor configured for detecting the presence of the brush located at least partially inside the brush holder. The brush sensor is configured to transmit a wireless signal. One or more antennas are disposed within the dynamoelectric machine, and the one or more antennas are configured to transmit an interrogating signal to the brush sensor and receive the wireless signal from the brush sensor. The brush sensor receives its power from a battery located inside the brush sensor. The wireless signal is transformable into an indication of a remaining life of the brush.

BRIEF DESCRIPTION OF THE DRAWINGS

These and other features of this invention will be more readily understood from the following detailed description of the various aspects of the invention taken in conjunction with the accompanying drawing that depicts various embodiments of the invention, in which.

It is noted that the drawings of the invention are not necessarily to scale. The drawings are intended to depict only typical aspects of the invention, and therefore should not be considered as limiting the scope of the invention.

DETAILED DESCRIPTION OF THE INVENTION

Figure 1:
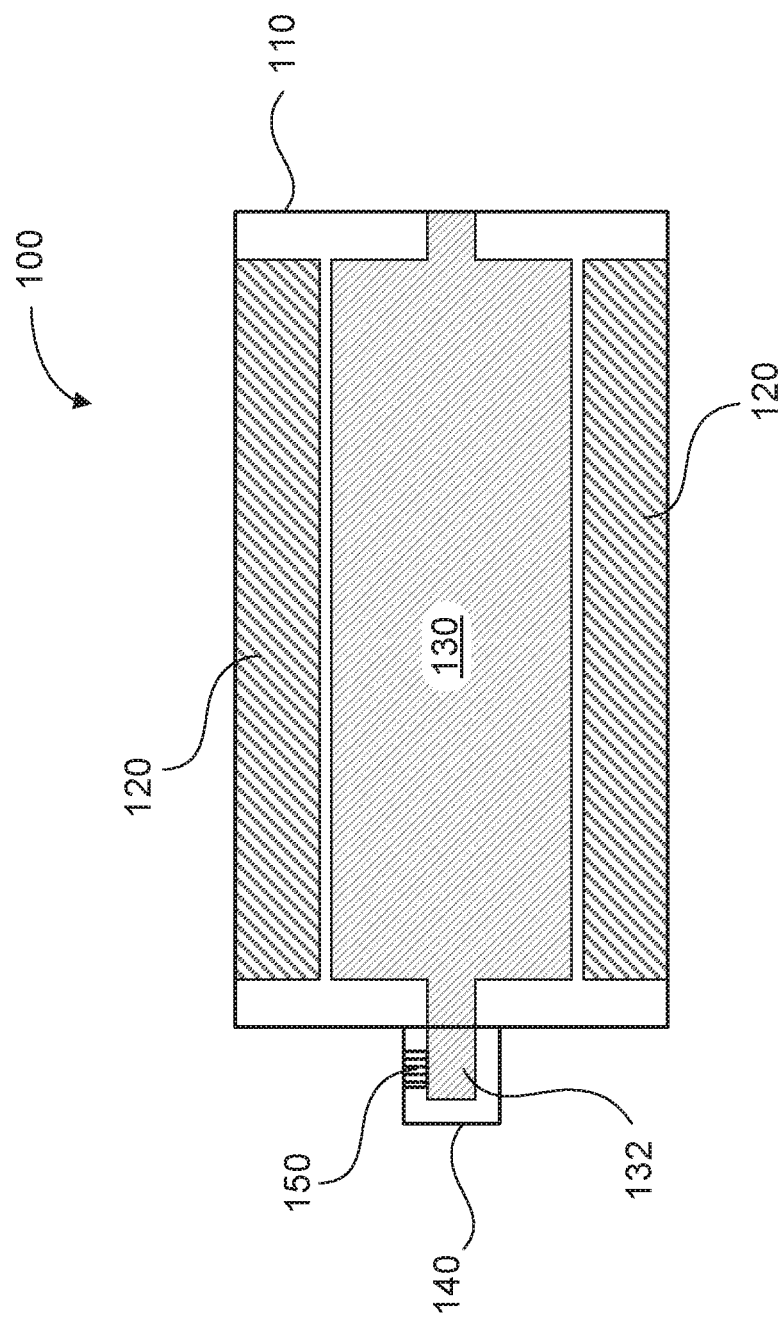
FIG. 1 illustrates a simplified cross-sectional view of a dynamoelectric machine.

FIG. 1 illustrates a simplified cross-section view of a dynamoelectric machine 100. The dynamoelectric machine 100 may be a generator or a motor, or any other device that converts mechanical energy to electrical energy or vice versa. The dynamoelectric machine includes a housing 110 that contains a stator 120 and a rotor 130. The rotor 130 includes a collector (or commutator) section 132 housed within a brush enclosure 140. The brush enclosure 140 contains one or more brush assemblies 150. Each brush assembly typically holds one or more brush holders, where each brush holder contains a brush. The brush is typically a carbon and/or graphite block that is used to conduct electricity to or from the collector 132.

Figure 3:
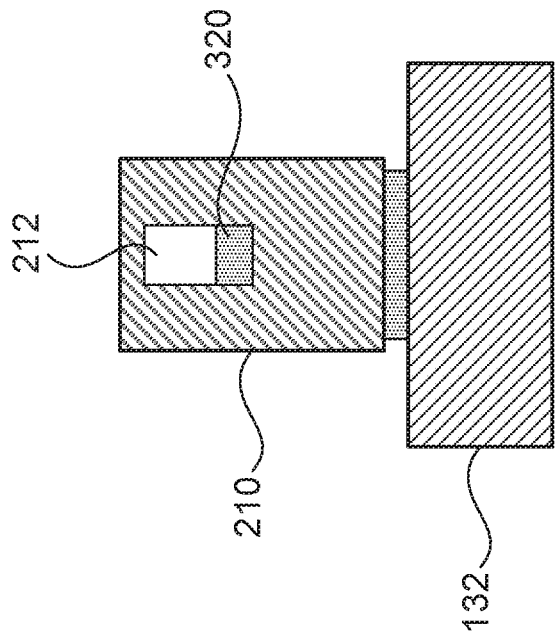
FIG. 3 illustrates a simplified front view of a brush collector located over a partially shown collector, with a relatively worn brush.
Figure 2:
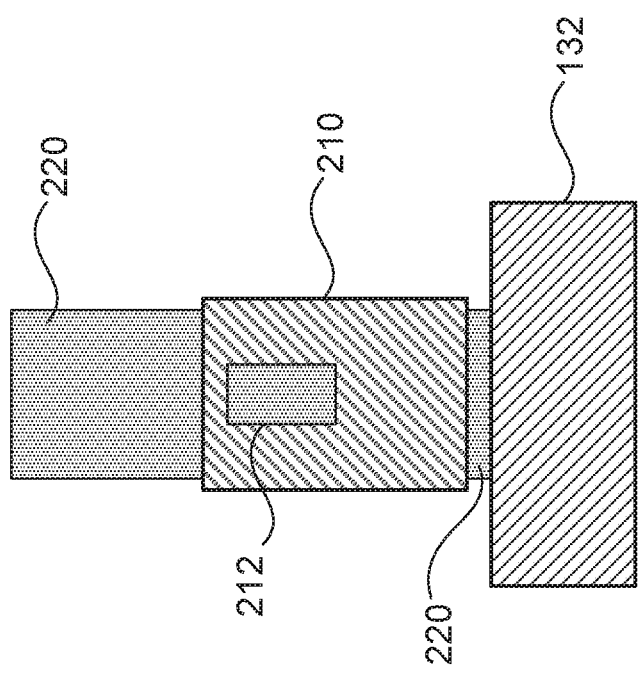
FIG. 2 illustrates a simplified front view of a brush collector located over a partially shown collector, with a relatively un-worn brush.

FIG. 2 and FIG. 3 illustrate a simplified front view of a brush collector located over a partially shown collector. The collector 132 is a rotating part of dynamoelectric machine 100, and there will typically be a plurality of brush holders 210 located around at least a portion of collector 132. Each brush holder 210 holds or contains a removable and replaceable brush 220, 320. As stated previously, the brush 220, 320 may be formed of carbon and/or graphite and conducts electricity between collector 132 and other components of the dynamoelectric machine 100. The brush 220, 320 wears down over use and must be replaced eventually. FIG. 2 shows a "new" brush 220 that has experienced little to no wear. FIG. 3 shows a "worn" brush 320 that is nearing time for replacement. The brush holder 210 may also include one or more slots or windows 212 that can be used for visual inspection of the condition of the brush 220, 320, and for viewing of the brush by the proximity sensor.

Figure 4:
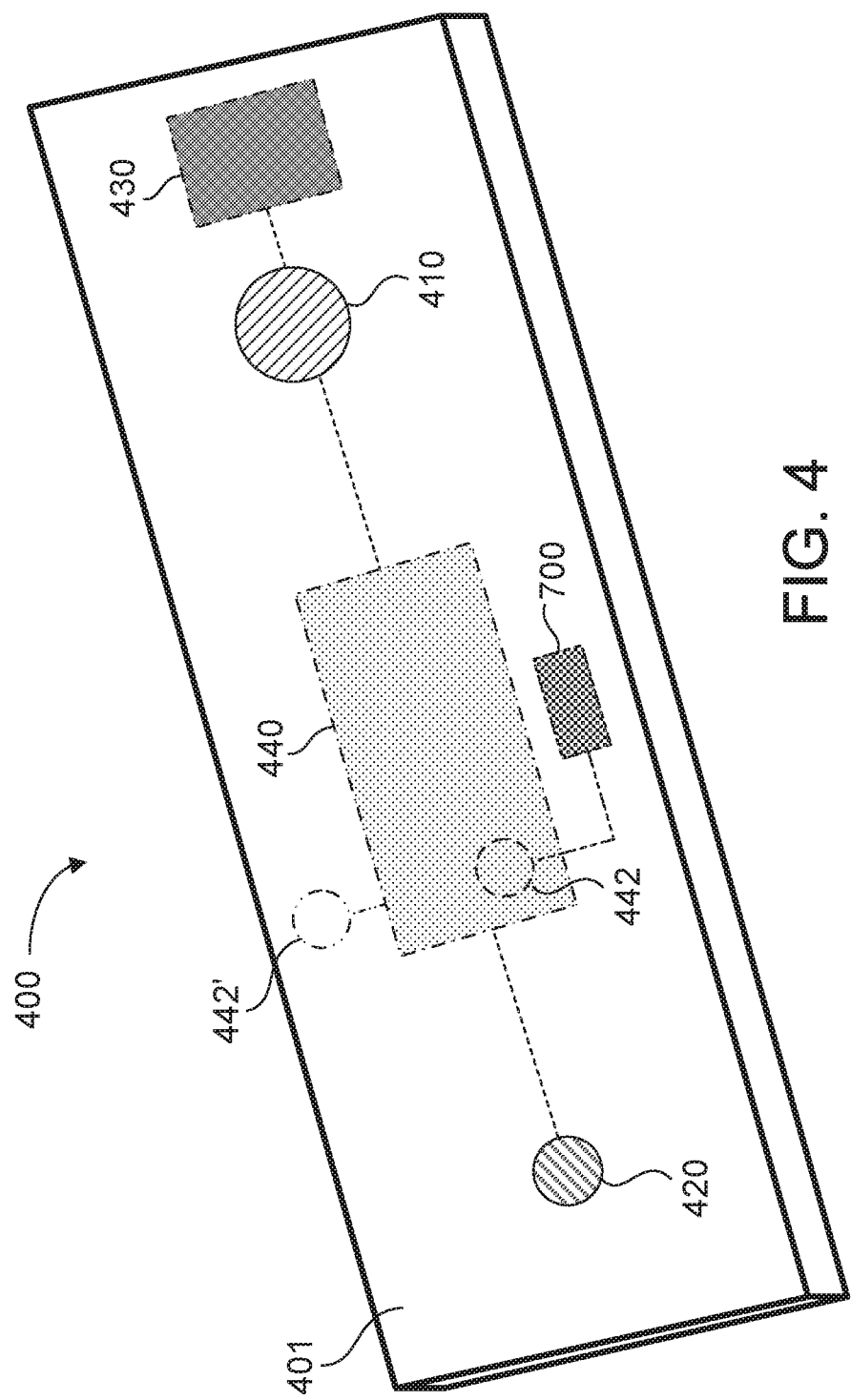
FIG. 4 illustrates a simplified isometric view of an apparatus that may be used for monitoring brush wear in a dynamoelectric machine, according to an aspect of the present invention.

FIG. 4 illustrates a simplified isometric view of an apparatus 400 that may be used for monitoring brush wear in a dynamoelectric machine. The apparatus 400 includes a main body 401 that is configured for attachment to a brush holder 210. Adhesive (not shown) may be placed between the main body 401 and the brush holder 210, to securely mount the apparatus in the desire location. Alternatively, magnets or hook and loop fasteners could also be used to attach the apparatus 400 to the brush holder 210.

The apparatus 400 includes a proximity sensor 410 on or in the main body 401. The proximity sensor 410 is configured for detecting the presence and/or position of a brush 220, 320 located inside the brush holder 210. The proximity sensor 410 may be an inductor coil circuit, an electro-mechanical switch or any other suitable proximity sensing device. For example, the inductor coil circuit could be configured to provide a signal representative of a position of the brush inside the brush holder, as described hereinafter.

The main body 401 may also include a temperature sensor 420, and the temperature sensor 420 is configured for detecting the temperature of the brush holder 210 and/or the air temperature near the brush holder 210. The temperature sensor may be a resistor, resistance temperature sensor (RTD), thermistor, thermocouple, or any other suitable temperature sensing device.

The apparatus 400 is configured to transmit a wireless signal to a remote location (e.g., one or more antennas), and this wireless signal is representative of a remaining life of the brush 220, 320. For example, "representative" is defined as being able to be used for determining the condition, state and/or position of the brush 220, 320 in brush holder 210. The condition, state or position may be a PASS (e.g., good) or FAIL (e.g., replace). Alternatively, the position of the top of the brush 320 may be detected (by the inductor coil circuit or the electro-mechanical switch) as it passes by the proximity sensor 410, and this changing position may be used to estimate the remaining life of the brush in a temporal period (e.g., 2 weeks of life remaining before replacement needed).

The apparatus 400 is preferably comprised of low voltage and low amperage components to reduce current consumption. This enables the apparatus to be fully passive in that it receives all of its power from the interrogating signals sent by the antenna(s) 630. Since the apparatus 400 is passive, the apparatus and system 600 can be fully operational when the dynamoelectric machine is neither energized nor in operation. The passive apparatus may be configured to have low current consumption, and these low current consumption levels provide substantially improved results, because wires leading to each and every apparatus 400 are no longer required. These results were unexpected because it was not anticipated that such a low power device would perform satisfactorily in a dynamoelectric machine environment, however testing has proven that accurate and reliable results have been obtained with the apparatus 400 as herein described.

Figure 6:
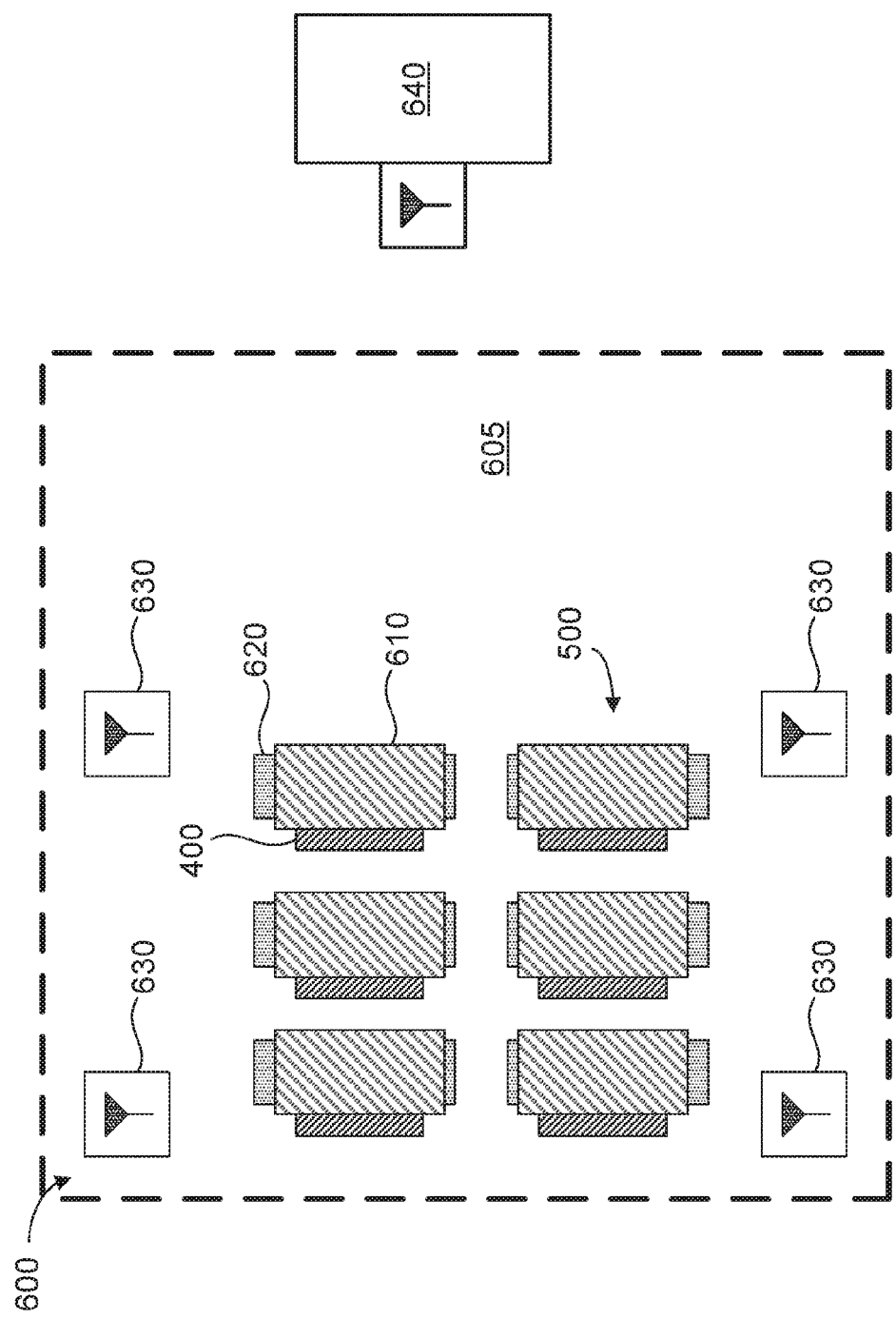
FIG. 6 illustrates a simplified schematic view of a system in a dynamoelectric machine, according to an aspect of the present invention.

The apparatus 400 may be configured as a radio frequency identification (RFID) device or tag, which can transmit and receive wireless signals to and/or from a receiving antenna. The RFID device may transmit in a frequency range of about 800 MHz to about 1 GHz, or any other suitable frequency range. The RFID device may be configured as a passive device and receive its power from an interrogating signal, such as that received from a remotely located or nearby antenna (e.g., the one or more antennas 630, as shown in FIG. 6). The RFID device may also be configured as an active RFID device that contains its own power source (e.g., a battery 442), or it may be configured as a hybrid active/passive RFID device where power is obtained from an internal power source and an external power source. Battery 442 may be located inside the brush sensor or apparatus 400 (as shown by battery 442), or inside the main body 410 (as shown by battery 442'), or inside the RFID chip 440 (as shown by battery 442).

The apparatus 400 may include a variety of low power circuits and devices. As only one non-limiting example, the apparatus 400 includes a proximity sensor 410, which may be an inductor coil, a temperature sensor 420, an antenna 430 and an RFID chip 440. It is to be understood that additional or different circuits, components and IC chips could be used to comprise the apparatus as well.

Figure 5:
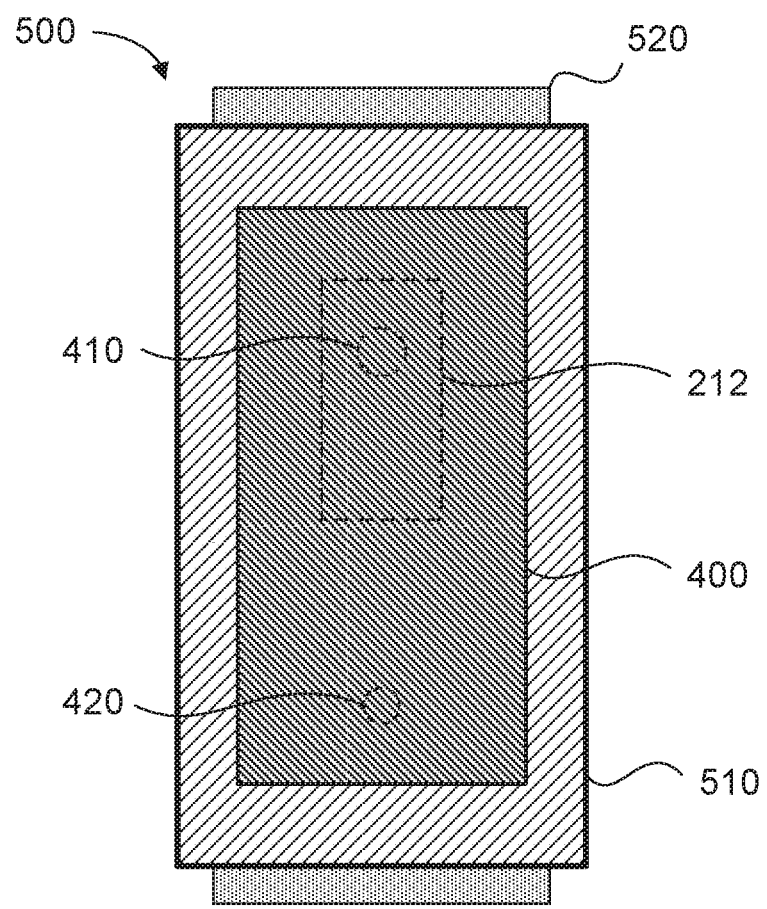
FIG. 5 illustrates a simplified side view of an apparatus comprised of a brush holder and a brush sensor, according to an aspect of the present invention.

FIG. 5 illustrates a simplified side view of an apparatus comprised of a brush holder and a brush sensor. According to an aspect of the present invention, the apparatus 500 may also include a brush holder 510 configured for holding a brush 520, where the brush holder 510 is configured for use in a dynamoelectric machine. A brush sensor 400 is attached to the brush holder 510, and the brush sensor 400 includes a proximity sensor 410 configured for detecting the presence of the brush 520 located at least partially inside the brush holder 510. The brush sensor 400 includes a temperature sensor 420 configured for detecting the temperature of at least one of the brush holder 510 and an air temperature near the brush holder 510. The proximity sensor 410 is located or positioned in viewing window 212.

The brush sensor 400 is configured to transmit a wireless signal that is representative of, or may be used to determine, a remaining life of the brush 520 and/or an abnormal operating condition of the brush via an excessively high or low temperature. The wireless signal is transformable into an indication of a normal or abnormal operating condition of the brush, or into an indication of the remaining life of the brush 220, 320. For example, a brush temperature that is too high or too low, may indicate an abnormal operating condition of the brush, whereas a temperature within normal operating parameters may indicate a normal operating condition. A signal from proximity sensor 410 may be transformable into an indication of the remaining life of the brush

220, 320, and this indication can be a binary type indication or display (e.g., GOOD or REPLACE), or it may have greater specificity (e.g., GOOD (or greater than a minimum amount of time), 5 weeks left, 4 weeks left, 3 weeks left, 2 weeks, left, etc.). It is to be understood that time increments of various quantities (e.g. years, months, weeks, days, hours, etc.) or specific brush lengths (e.g., mm, cm, etc.) may be used to determine or indicate the amount of remaining brush life as well.

FIG. 6 illustrates a simplified schematic view of a system in a dynamoelectric machine. According to an aspect of the present invention the system 600 includes one or more brush holders 610 configured for holding a brush 620, the brush holder 610 configured for use in a dynamoelectric machine 605. For example, the dynamoelectric machine may be a generator or a motor. A brush sensor 400 is attached to the brush holder 610, and the brush sensor 400 includes a proximity sensor 410 (shown in FIG. 4) configured for detecting the presence of the brush 620 located at least partially inside the brush holder 610. The brush sensor 400 may also include a temperature sensor 420 (shown in FIG. 4) configured for detecting the temperature of the brush holder 610 and/or an air temperature near the brush holder 610. The brush sensor 400 is configured to transmit a wireless signal to one or more antennas 630 disposed within or near the dynamoelectric machine 605, where the one or more antennas 630 are configured to receive the wireless signal from (and transmit energy to) the brush sensor 400. The wireless signal is representative of, or may be used for determining, a remaining life of the brush 620. As each brush sensor 400 may be assigned a unique identification code, it is possible to identify the state or condition of each brush 620.

The system 600 may transmit data to a local or remotely located monitoring station 640. A technician can view the received data (from the wireless signals) and monitor the state or condition of each brush in the dynamoelectric machine 605. The data regarding each brush may be displayed in graphical or tabular form, and could be transformed into an indication of the remaining life of each brush or the amount of time until the brush fails or the amount of time until replacement is needed.

Figure 7:
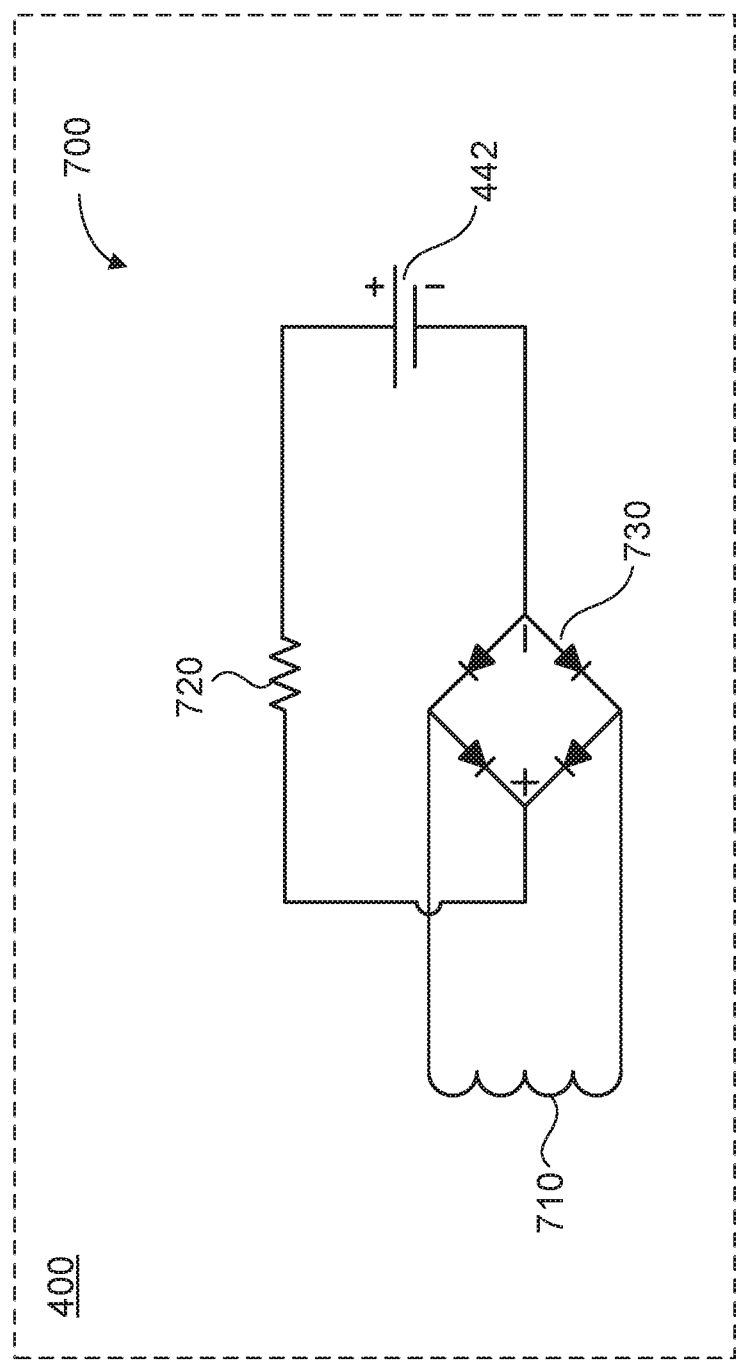
FIG. 7 illustrates a schematic view of an inductive charging system used to recharge the battery, according to an aspect of the present invention.

FIG. 7 illustrates a schematic view of an optional inductive charging system 700 used to recharge the battery 442 (or 442'), according to an aspect of the present invention. The inductive charging system charges battery 442, or keeps battery 442 in a charged state. Preferably, inductive charging system is configured as a constant trickle charger supplying current to the battery 442 only when needed to maintain a desired battery voltage. An inductor coil 710 is a coil of wire or a printed or etched conductor in an inductive pattern. The number of turns of coil 710 is selected depending on the voltage desired at the input of resistor 720 and/or battery 442. The inductor coil 710 is connected to a rectifier 730 (e.g., a bridge rectifier) comprised of four (or more) diodes. The rectifier 730 is connected to the battery 442 and resistor 720. The bridge circuit configuration provides the same output polarity for either input polarity, and is used for converting an alternating current (AC) input into a direct current (DC) output. The resistor 720 may be used to reduce the current and/or limit the voltage level appearing on the positive terminal of battery 442. In other words, the value of the resistor 720 is chosen so that the voltage drop across the resistor 720 sets the current charge that goes into the battery 442. As battery 442 approaches a full charge state, then the voltage across the resistor 720 equalizes and current flow ceases. When the voltage across the resistor is equal, current flow stops and is essentially zero. As the battery 442 discharges, the voltage drop across the resistor will increase and current will flow towards the battery. The circuit shown in FIG. 7 functions as a trickle charger, at least when the dynamoelectric machine is operating. The magnetic field created by the operating dynamoelectric machine is used to power the inductive charging system 700. The inductive charging system 700 may be located in the apparatus or brush sensor 400 or in the RFID chip 440.

The apparatus, brush holder and system is configured to monitor a variety of conditions of the brush and/or brush holder using sensor types including: temperature, electromagnetic, pressure, strain, acceleration, resistance, electromechanical, magneto resistive, hall effect, current measurement and/or other suitable devices. The apparatus' and sensor(s) can be located on (in physical contact with) and/or proximate to, a brush holder, for assessing the general condition of the brush/commutator apparatus of the dynamoelectric machine. In one particular embodiment, brush position and/or temperature measurements provide a mechanism for determining whether and when to perform brush replacement or adjustment.

One advantage provided by the present invention, is that the apparatus (or brush sensor) 400 can be added to an existing brush holder, so that the brush itself does not have to be modified. As the brush is a "consumable item, this provides an economic advantage to the user, because they can purchase, use and replace standard brushes for low cost. The apparatus and system herein described also avoids the use of extra wires attached to the brush holder or brush itself. The "extra wires" approach has potential for additional shorting paths and excessively noisy signals from the adjacent energized components. It also interferes with visual inspection and the brush changing operation. The present invention also provides the advantage of eliminating sensors physically attached or embedded within the brush. This reduces cost and eliminates the possibility that the brush will be adversely affected when sliding along the brush holder, as any attachment onto the brush presents the possibility for the brush to get stuck in the brush holder. If a brush gets stuck and stops sliding down the brush holder, a gap will form between the brush and commutator, and this could lead to undesired arcing and eventual machine failures. Another advantage to the apparatus and brush holder of the present invention is that by being fully passive it does not require batteries for its power source. Batteries generally have very limited output and short lives at the elevated temperatures of the brush environment. It can also be fully operational when the rest of the dynamoelectric machine is not in operation.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An apparatus configured for use with a dynamoelectric machine, the apparatus comprising:
   a main body configured for attachment to a brush holder;
   a proximity sensor on the main body, the proximity sensor configured for detecting the presence of a brush located at least partially inside the brush holder;
   wherein the apparatus receives power from a battery located inside the apparatus, and transmits a wireless signal, the wireless signal is transformable into an indication of a remaining life of the brush, and the apparatus is fully operational when the dynamoelectric machine is neither energized nor in operation, as the apparatus receives power from the battery.

2. The apparatus of claim 1, wherein the apparatus is located on an exterior surface of the brush holder, and the apparatus does not physically contact the brush.

3. The apparatus of claim 1, further comprising:
   a temperature sensor on the main body, the temperature sensor configured for detecting a temperature of at least one of the brush holder and air near the brush holder; and
   wherein the wireless signal is transformable into an indication of a remaining life of the brush.

4. The apparatus of claim 1, the proximity sensor comprising at least one of:
   an inductor coil circuit and an electro-mechanical switch.

5. The apparatus of claim 1, wherein the proximity sensor is comprised of an inductor coil circuit, and the inductor coil circuit is configured to provide a signal representative of a position of the brush inside the brush holder.

6. The apparatus of claim 1, the main body further comprising:
   a radio frequency identification (RFID) device configured to transmit the wireless signal to one or more antennas.

7. The apparatus of claim 1, the main body comprising:
   an inductive charging system configured to charge the battery from an operating dynamoelectric machine, the inductive charging system including an inductor coil connected to a rectifier, and the rectifier is connected to the battery.

8. An apparatus comprising:
   a brush holder configured for holding a brush, the brush holder configured for use in a dynamoelectric machine;
   a brush sensor attached to the brush holder, the brush sensor comprising a proximity sensor configured for detecting the presence of the brush located at least partially inside the brush holder; and
   wherein the brush sensor contains a battery located inside the brush sensor, and the brush sensor is configured to transmit a wireless signal, the wireless signal is transformable into an indication of a remaining life of the brush, and the brush sensor receives its power from the battery.

9. The apparatus of claim 8, wherein the brush sensor is located on an exterior surface of the brush holder, and the brush sensor does not physically contact the brush.

10. The apparatus of claim 8, further comprising:
    a temperature sensor configured for detecting a temperature of at least one of the brush holder and air near the brush holder;
    wherein the wireless signal is transformable into an indication of a remaining life of the brush.

11. The apparatus of claim 8, the proximity sensor comprising at least one of:
    an inductor coil circuit and an electro-mechanical switch.

12. The apparatus of claim 11, the brush sensor further comprising:
    a radio frequency identification (RFID) device configured to transmit the wireless signal to one or more antennas.

13. The apparatus of claim 8, wherein the proximity sensor is comprised of an inductor coil circuit configured to provide a signal representative of a position of the brush inside the brush holder.

14. The apparatus of claim 8, the brush sensor comprising:
    an inductive charging system configured to charge the battery from an operating dynamoelectric machine, the inductive charging system including an inductor coil connected to a rectifier, and the rectifier is connected to the battery.

15. A system comprising:
    a brush holder configured for holding a brush, the brush holder configured for use in a dynamoelectric machine;
    a brush sensor attached to the brush holder, the brush sensor comprising a proximity sensor configured for detecting the presence of the brush located at least partially inside the brush holder, and wherein the brush sensor is configured to transmit a wireless signal;
    one or more antennas disposed within the dynamoelectric machine, the one or more antennas configured to transmit an interrogating signal to the brush sensor and receive the wireless signal from the brush sensor, the brush sensor receiving its power from a battery located inside the brush sensor; and
    wherein the wireless signal is transformable into an indication of a remaining life of the brush.

16. The system of claim 15, further comprising:
    a temperature sensor configured for detecting a temperature of at least one of the brush holder and air near the brush holder; and
    wherein the wireless signal is transformable into an indication of a normal or abnormal operating condition of the brush.

17. The system of claim 15, the proximity sensor comprising at least one of:
    an inductor coil circuit and an electro-mechanical switch.

18. The system of claim 15, the brush sensor further comprising:
    a radio frequency identification (RFID) device configured to transmit the wireless signal to the one or more antennas.

19. The system of claim 15, wherein the brush sensor is located on an exterior surface of the brush holder, and the brush sensor does not physically contact the brush.

20. The system of claim 15, the brush sensor comprising:
    an inductive charging system configured to charge the battery from an operating dynamoelectric machine, the inductive charging system including an inductor coil connected to a rectifier, and the rectifier is connected to the battery.

* * * * *